(12) United States Patent
Wang et al.

(10) Patent No.: US 7,055,577 B2
(45) Date of Patent: Jun. 6, 2006

(54) HEAT DISSIPATION DEVICE FOR ELECTRONIC DEVICE

(75) Inventors: Yaxiong Wang, Austin, TX (US); Shun Chi Dong, Austin, TX (US); Chung-Yuan Huang, Austin, TX (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 119 days.

(21) Appl. No.: 10/778,704

(22) Filed: Feb. 12, 2004

(65) Prior Publication Data

US 2005/0178527 A1    Aug. 18, 2005

(51) Int. Cl.
*F28F 7/00* (2006.01)

(52) U.S. Cl. ..................................... 165/80.3; 165/185
(58) Field of Classification Search ............. 165/80.2, 165/80.3, 185
See application file for complete search history.

(56) References Cited

U.S. PATENT DOCUMENTS

| | | | | |
|---|---|---|---|---|
| 6,199,624 | B1* | 3/2001 | Wotring | 165/80.3 |
| 2001/0037875 | A1* | 11/2001 | Guerrero | 165/80.3 |
| 2003/0066626 | A1* | 4/2003 | Bird et al. | 165/80.3 |
| 2003/0102110 | A1* | 6/2003 | Wagner | 165/80.3 |
| 2003/0137047 | A1* | 7/2003 | Lopatinsky et al. | 165/185 |
| 2004/0108104 | A1* | 6/2004 | Luo | 165/80.3 |
| 2004/0200601 | A1* | 10/2004 | Bamford et al. | 165/80.3 |
| 2004/0261975 | A1* | 12/2004 | Kozyra et al. | 165/80.3 |
| 2005/0061480 | A1* | 3/2005 | Carter et al. | 165/80.3 |
| 2005/0073811 | A1* | 4/2005 | Wang et al. | 165/80.3 |
| 2005/0161196 | A1* | 7/2005 | Hsieh | 165/80.3 |

FOREIGN PATENT DOCUMENTS

EP    1117284    * 7/2001

* cited by examiner

*Primary Examiner*—Teresa J. Walberg
(74) *Attorney, Agent, or Firm*—Wei Te Chung

(57) ABSTRACT

A heat dissipation device includes a column (1) for being positioned on an electronic device for dissipating heat therefrom, a plurality of fin units (5) attached to and stacked along the column, an H-shaped securing member (3) attached to the column below the fin units for securing the heat dissipation device to the electronic device, a pair of fan supports (7) extending from opposite sides of the securing member, and a fan (9) mounted on the fan supports. The fin units define a plurality of sprial air passages along an axis of the column which consist with air flow of the fan. Each of the fin units is configured by a metal disc with a plurality of sectors (54, 54', 54") and channels (56, 56', 56") between adjacent sectors.

22 Claims, 4 Drawing Sheets

HEAT DISSIPATION DEVICE FOR ELECTRONIC DEVICE

BACKGROUND OF THE INVENTION

1. Field of the Invention

The present invention relates to a heat dissipation device for electronic devices, and particularly to a heat dissipation device incorporating a plurality of stacked fins.

2. Related Art

Electronic devices such as central processing units (CPUs) generate a lot of heat during normal operation. If the heat generated is not properly dissipated, it can deteriorate their operational stability and damage associated electronic devices. Thus the heat must be removed quickly and efficiently to ensure normal operation. A heat dissipation device is often attached to a top surface of a CPU, to remove heat therefrom.

A conventional heat dissipation device is made by extrusion, which significantly limits the height of its formed fins. To resolve the problem, another kind of heat dissipation device has been developed. Fins of such device are folded from a metal sheet. The folded fins are then adhered to a base which is for contacting an electronic device. The device has a large heat dissipating surface area. However, because the fins are adhered to the base air gap inevitablely exists between the base and the fins. This reduces heat transmit efficiency from the base to the fins.

Thus a cylindrical heat dissipation device has been developed. U.S. Pat. No. 6,330,908 shows such kind of conventional heat dissipation device. The heat dissipation device comprises a cylindrical core and a plurallity of vertical fins attachably surrounding the core. A mounting plate is fixed on a top of the core by screws. A fan is fixed on the mounting plate by screws. However, air passages between the fins are vertical which do not consist with spiral air flow of the fan. Furthermore, the mounting plate locates between the fan and the fins and extends transversely the air flow of the fan. These obstructs the air flow of the fan flowing through the fins and limits heat dissipation of the fins, thereby reducing the efficiency of heat transfer of the heat dissipation device.

Then, another kind of cylindrical heat dissipation device having spiral air passages formed therein is developed. However, a mounting plate on which a fan is mounted is stilled fixed on a top of a cylindrical core of the heat dissipation device between the fan and the fins, which obstructs the air flow of the fan flowing through the fins and limits heat dissipation of the fins, thereby reducing the efficiency of heat transfer of the heat dissipation device.

SUMMARY OF THE INVENTION

Accordingly, an object of the present invention is to provide a heat dissipation device which can efficiently dissipate heat from an electronic device.

To achieve the above-mentioned object, a heat dissipation device in accordance with the present invention comprises a column for being positioned on an electronic device for dissipating heat therefrom, a plurality of fin units attached to and stacked along the column, an H-shaped securing member attached to the column below the fin units for securing the heat dissipation device to the electronic device, a pair of fan supports extending from opposite sides of the securing member, and a fan mounted on the fan support. The fin units define a plurality of sprial air passages along an axis of the column which consist with air flow of the fan. Each of the fin units is configured by a metal disc with a plurality of sectors and channels between adjacent sectors.

Other objects, advantages and novel features of the present invention will be drawn from the following detailed description of a preferred embodiment of the present invention with attached drawings, in which:

DETAILED DESCRIPTION OF THE INVENTION

Figure 1:
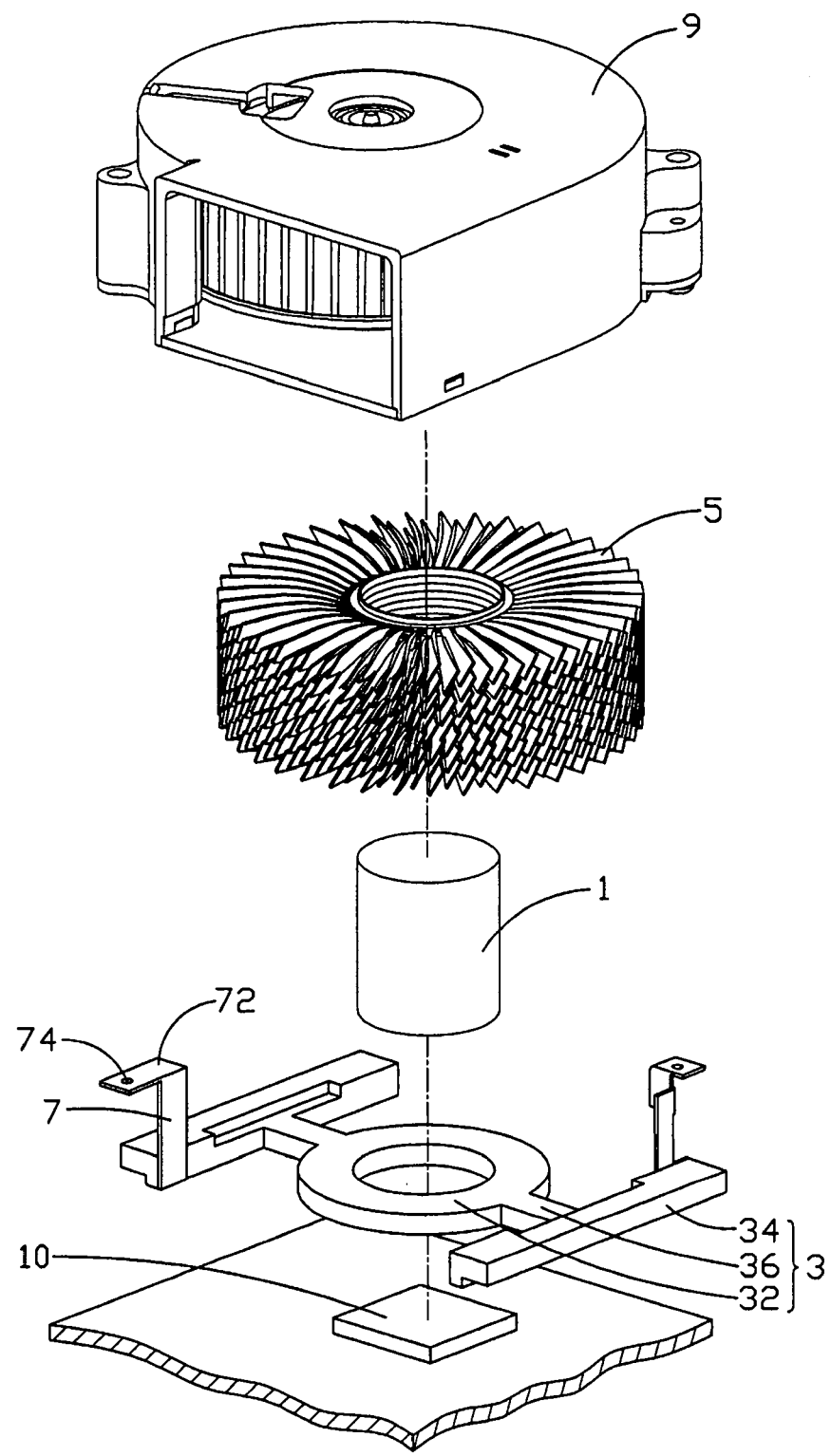
FIG. 1 is an exploded view of a heat dissipation device in accordance with a preferred embodiment of the present invention, together with an electronic device.
Figure 2:
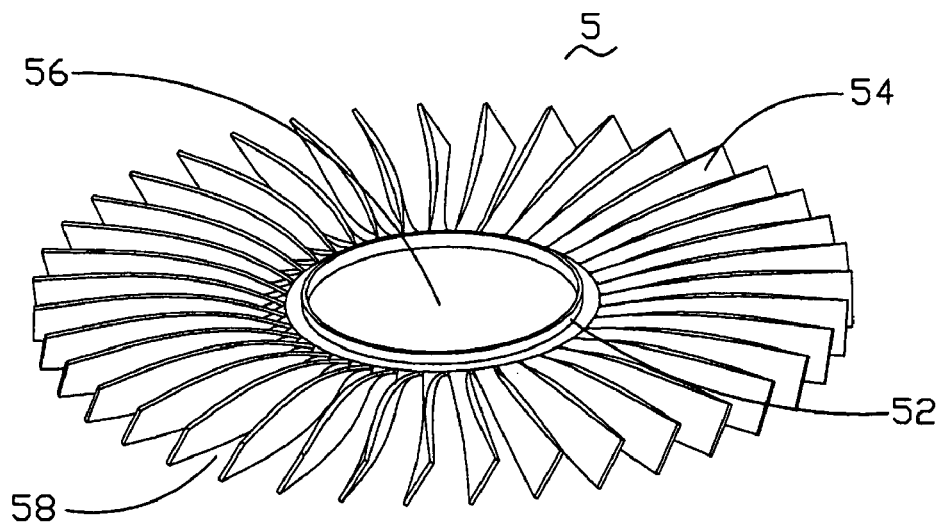
FIG. 2 is an isometric view of a fin unit of the heat dissipation device of FIG. 1.
Figure 3:
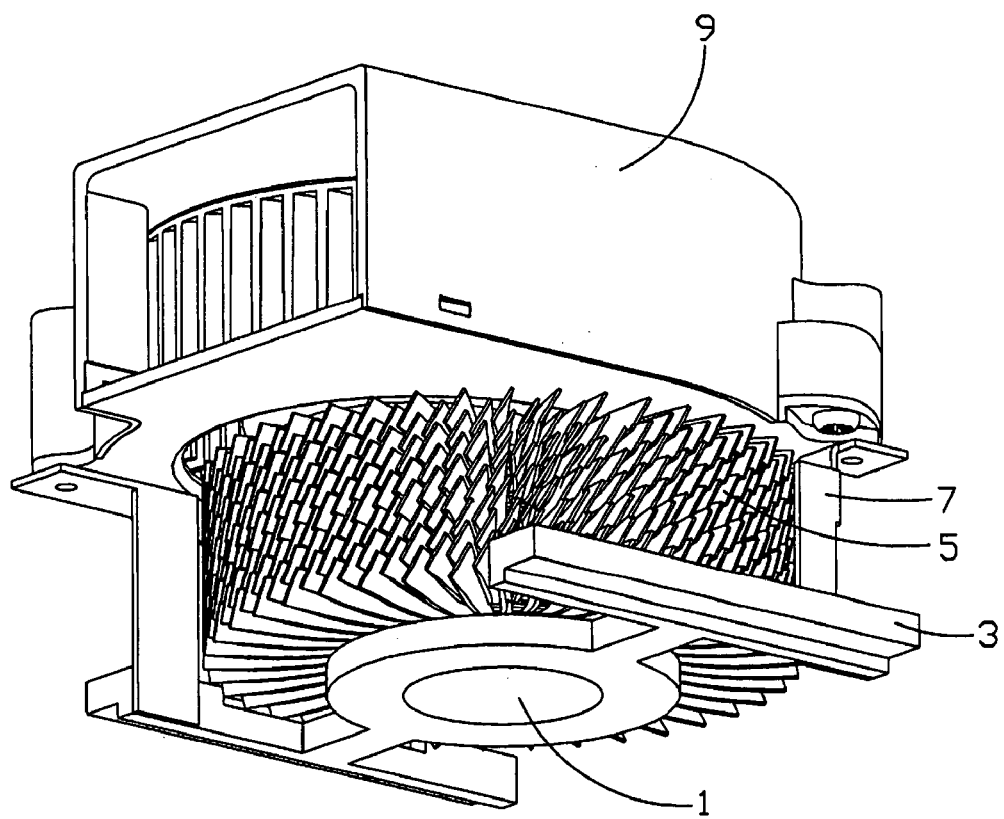
FIG. 3 is an assembled view of the heat dissipation device of FIG. 1.

Referring to FIGS. 1–3, a heat dissipation device in accordance with the preferred embodiment of the present invention comprises a cylindrical column 1 for being positioned on an electronic device 10, a securing member 3 for securing the heat dissipation device to the electronic device 10, a plurality of fin units 5 attachably surrounding the column 1, a pair of fan supports 7 extending from the securing member 3, and a fan 9 mounted on the fan support 7.

The column 1 is made of heat conductive material such as copper or aluminum. The column 1 may be a solid column or a hollow heat pipe filled with coolant.

The securing member 3 is generally H-shaped and comprises a base 32, a pair of securing bars 34, and a pair of connecting bars 36 connected the base 32 and the securing bars 34. The base 32 is circular shape and defines a central through hole (not labeled) for extension of the column 1 therethrough. The column 1 is fixed in the through hole of the base 32 by welding. Alternatively, the column 1 can be fixed in the through hole of the base 32 by other mechanical connection methods, such as: the column 1 interferentially engaged in the through hole. The securing bars 34 are parallel to each other and perpendicular to the connecting bars 36.

The fan support 7 is generally L-shaped and soldered to a corresponding securing bar 34. The fan support 7 comprises a mounting tab 72 defining a mounting hole 74 for mounting the fan 9 thereon.

The fin unit 5 is made by pressing a metal sheet to form a disc shape and comprises a circular mounting portion 52 and a plurality of spiral sectors 54 extending generally radially from the mounting portion 52. The mounting portion 52 defines a through opening 56 in a center thereof, for extension of the column 1 therethrough. A plurality of spiral channels 58 is formed between adjacent sectors 54. The fin units 5 are sequentially stacked along the column 1 to cooperatively form a heat sink for dissipating heat from the electronic device 10. The column 1 extends through the through holes 56 of the fin units 5 and the mounting portions 52 of the fin units 5 are fixed to the column 1 by welding. The channels 58 of the fins units 5 cooperatively forms a plurality of sprial air passages along an axis of the column 1.

The fan 9 is fixedly supported on the mounting tabs 72 of the fan supports 7 and located above the fin units 5. The fan 9 comprises an air inlet in communication with the passages, and an air outlet perpendicular to the air inlet.

Figure 4:
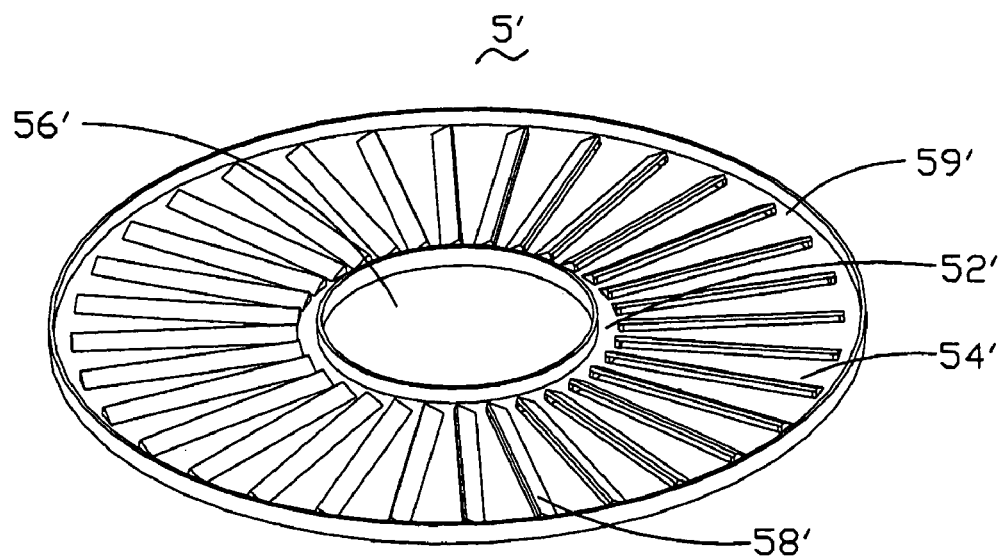
FIG. 4 is a fin unit of a heat dissipation device in accordance with an alternative embodiment of the present invention.
Figure 5:
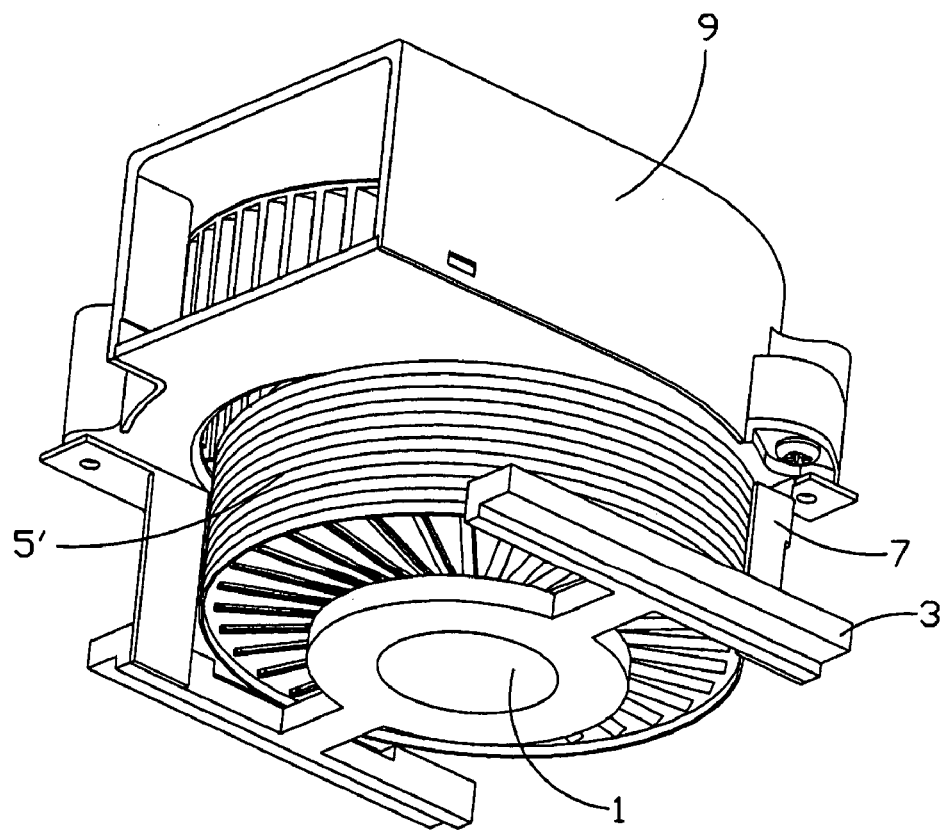
FIG. 5 is an assembled view of the heat dissipation device in accordance with the alternative embodiment of the present invention.

FIGS. 4–5 show a heat dissipation device in accordance with an alternative embodiment of the present invention. The heat dissipation device in accordance with the alternative embodiment of the present invention is similar to the heat dissipation device in accordance with the preferred embodiment of the present invention except fin units 5' thereof. The fin unit 5' is made by pressing a metal sheet to form a disc shape and comprises a mounting portion 52', and a plurality of sectors 54' extending radially from the mounting portion 52'. The mounting portion 52' defines a mounting hole 56' therein for extension of the column 1 therethrough. A plurality of channels 58' is defined between adjacent sectors 54'. Each channel 58' has a parallelogramic cross section. A width of the channel 58' may be changeless or increase in a radial direction of the fin unit 5'. Each fin unit 5 comprises a continual peripheral edge portion 59' opposing the mounting portion 52'. The sectors 54' and the channels 58' span from the mounting portion 52' to the edge portion 59', respectively. The channels 58' of the fin units 5' cooperatively form a plurality of sprial air passages along the axis of the column 1.

Figure 6:
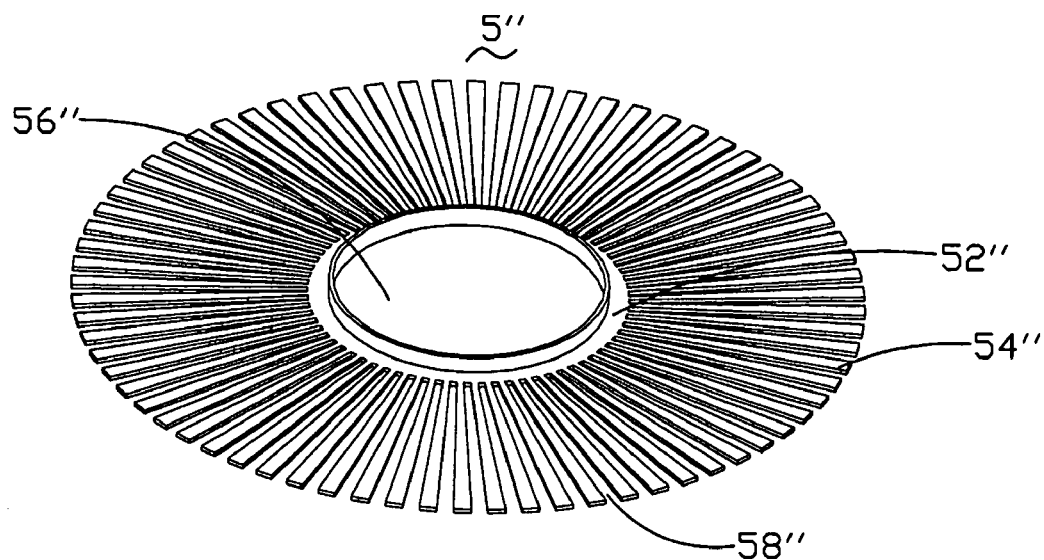
FIG. 6 is a fin unit of a heat dissipation device in accordance with a further alternative embodiment of the present invention.
Figure 7:
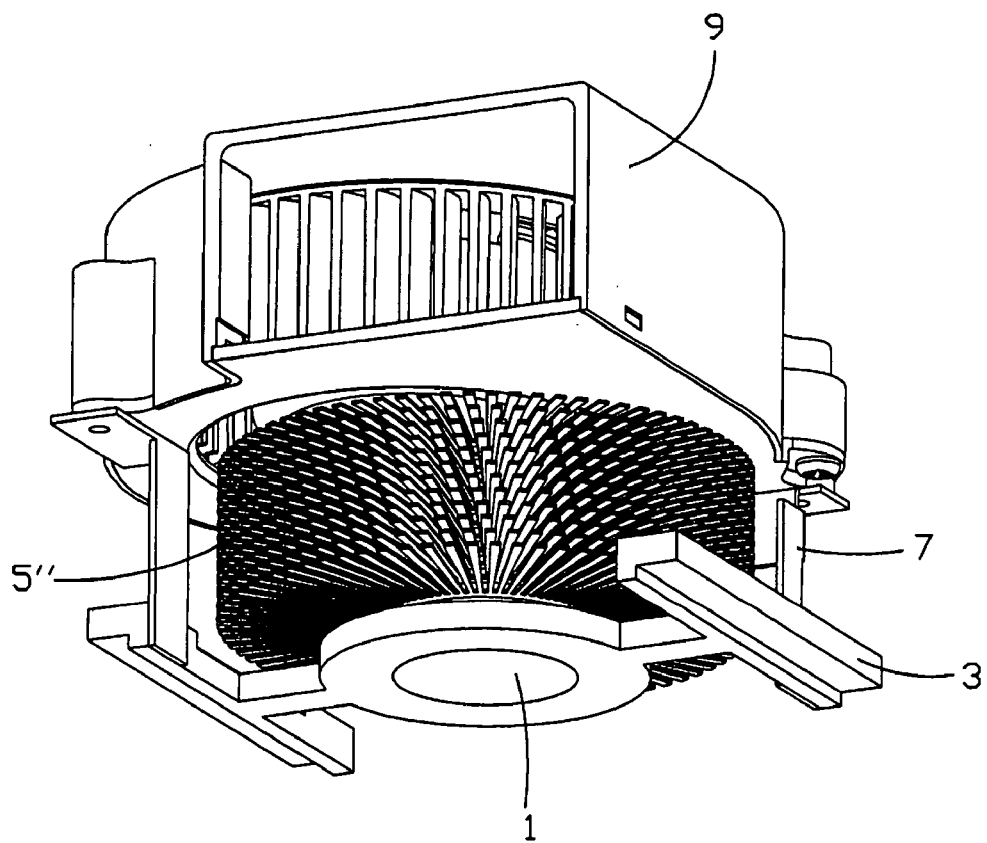
FIG. 7 is an assembled view of the heat dissipation device in accordance with the further alternative embodiment of the present invention.

FIGS. 6–7 show a heat dissipation device in accordance with a further alternative embodiment of the present invention. The heat dissipation device in accordance with the further alternative embodiment of the present invention is similar to the heat dissipation device in accordance with the preferred embodiment of the present invention except fin units 5" thereof. Each fin unit 5" is made by pressing a metal sheet to a flat disc shape, and comprises a mounting portion 52", and a plurality of sectors 54" extending radially from the mounting portion 52". The mounting portion 52" defines a mounting hole 56" therein for extension of the column 1 therethrough. A plurality of channels 58" is defined between adjacent sectors 54". The channels 58" of the fin units 5" cooperatively form a plurality of sprial air passages along the axis of the column 1.

In the present invention, the air passages of the fin units 5, 5', 5" are spiral along the axis of the column 1 which consist with air flow of the fan 9 and the fan supports 7 locate outsides of the air passages of the fin units 5, 5', 5". This facilitates cooling air to flow through the fin units 5, 5', and 5" thereby improving heat dissipation efficiency of the heat dissipation device.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A heat dissipation device for an electronic device, comprising:
   a body having a bottom face adapted to position on the electronic device for dissipating heat therefrom;
   a securing member extending from a lower portion of the body near the bottom face thereof and adapted for securing the heat dissipation device to the electronic device;
   a plurality of fin units attachably surrounding the body and located above the securing member;
   a pair of separate fan supports extending upwardly from two opposite sides of the securing member, respectively; and
   a fan mounted on the fan supports.

2. The heat dissipation device as claimed in claim 1, wherein each of the fin units is configured by a disc stacked along the body.

3. The heat dissipation device as claimed in claim 2, wherein each disc comprises a mounting portion attached to the body and a plurality of sectors extending substantially radially from the mounting portion, channels being defined between adjacent two sectors, the channels copperatively forming a plurality of spiral passages along an axis of the body.

4. The heat dissipation device as claimed in claim 3, wherein the fan locates above the fin units and comprises an air inlet in communication with the passages and an air outlet perpendicular to the air inlet.

5. The heat dissipation device as claimed in claim 4, wherein each fan support is L-shaped and comprises a flat mounting tab above which the fan is mounted.

6. The heat dissipation device as claimed in claim 4, wherein the sectors are spiral shape.

7. The heat dissipation device as claimed in claim 4, wherein the sectors are flat.

8. The heat dissipation device as claimed in claim 7, wherein each disc has a continual perimeter edge portion connecting outmost portions of the sectors, and said passages are therefore closed except top and bottom thereof.

9. A heat dissipation device adapted to attach to an electronic device for dissipating heat generated therefrom, comprising:
   a body having a bottom face adapted to attach to the electronic device;
   a securing member fixed to a lower portion of the body;
   a plurality fin units attached to and stacked along the body and located above the securing member, the fin units defining a plurality of spiral passages along the body;
   a fan for generating airflows through the spiral passages; and
   a fan support extending upwardly from the securing member, supporting the fan thereon and located outside the passages.

10. The heat dissipation device as claimed in claim 9, wherein the securing member is adapted for securing the heat dissipation device to the electronic device.

11. The heat dissipation device as claimed in claim 10, wherein the securing member is generally H-shaped and comprises a circular base defining a through hole with the body extending therethrough, a pair of securing bars to which a pair of said fan supports is attached, and a pair of connecting bars connected between the base and securing bars respectively.

12. The heat dissipation device as claimed in claim 11, wherein the body is column-shaped, and the spiral passages are along an axis of the body.

13. The heat dissipation device as claimed in claim 12, wherein each of the fin units is configured by a metal disc attachably surrounding the body, each disc comprising a plurality of sectors and channels between adjacent sectors.

14. The heat dissipation device as claimed in claim 13, wherein the sectors are spiral shape.

15. The heat dissipation device as claimed in claim 13, wherein the sectors are flat.

16. The heat dissipation device as claimed in claim 15, wherein each disc has a continual perimeter edge portion connecting outmost portions of the sectors, and said passages are therefore closed except top and bottom thereof.

17. A heat dissipation device adapted to attach to an electronic device for dissipating heat generated therefrom, comprising:
- a heat sink comprising:
- a column having a bottom face adapted to thermally contact the electronic device for removing heat thereform; and
- a plurality of discrete disk-like fin units stacked one another, each of said fin units defining a center circular mounting portion surrounding a through opening through which said column extends, each of said fin units comprising:
- a plurality of sectors outwardly and generally radially extending from said circular mounting portion, a plurality of channels being formed between the adjacent sectors, respectively, and
- a continual perimeter edge portion integrally connecting outmost portions of the sectors.

18. The heat dissipation device as claimed in claim 17, further comprising a securing member fixed to a lower portion of the column and adapted for securing the heat dissipation device to the electronic device, a fan support extending upwardly from the securing member and located outside the tin units, and a cooling fan attached to the fan support.

19. The heat dissipation device as claimed in claim 18, wherein the support member comprises a pair of separate fan supports extending from two opposite sides of the securing member, each fan support is L-shaped and comprises a flat mounting tab above which the fan is mounted.

20. The heat dissipation device as claimed in claim 17, wherein the channels copperatively form a plurality of spiral air passages in the fin units along an axis of the column, the air passages are closed cooperatively by the continual perimeter edge portions except top and bottom thereof.

21. The heat dissipation device as claimed in claim 17, wherein the sectors are spiral shape.

22. The heat dissipation device as claimed in claim 17, wherein the sectors are flat.

* * * * *